(12) United States Patent
Seaberg

(10) Patent No.: US 7,358,814 B2
(45) Date of Patent: Apr. 15, 2008

(54) DIFFERENTIAL AMPLIFIER AND METHODS FOR USE THEREWITH

(75) Inventor: Charles Eric Seaberg, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 144 days.

(21) Appl. No.: 11/389,779

(22) Filed: Mar. 27, 2006

(65) Prior Publication Data

US 2007/0222516 A1    Sep. 27, 2007

(51) Int. Cl.
*H03F 3/45*    (2006.01)
(52) U.S. Cl. .................. 330/261; 330/258; 327/65
(58) Field of Classification Search ............. 330/258, 330/261; 327/63–65
See application file for complete search history.

(56) References Cited

U.S. PATENT DOCUMENTS 5,805,021 A *   9/1998  Brehmer ..................... 330/253
6,313,667 B1 * 11/2001  Eschauzier .................. 327/65
7,030,699 B2 *  4/2006  Richard et al. ............. 330/297

* cited by examiner

*Primary Examiner*—Robert J. Pascal
*Assistant Examiner*—Hieu Nguyen
(74) *Attorney, Agent, or Firm*—Garlick Harrison & Markison; Bruce E. Stuckman

(57) ABSTRACT

A differential audio amplifier includes a differential input stage for producing an output voltage in response to a differential audio input signal. The differential input stage has a first bias voltage and a second basis voltage. A bias compensation module controls the first bias voltage to be substantially equal to the second bias voltage.

7 Claims, 6 Drawing Sheets

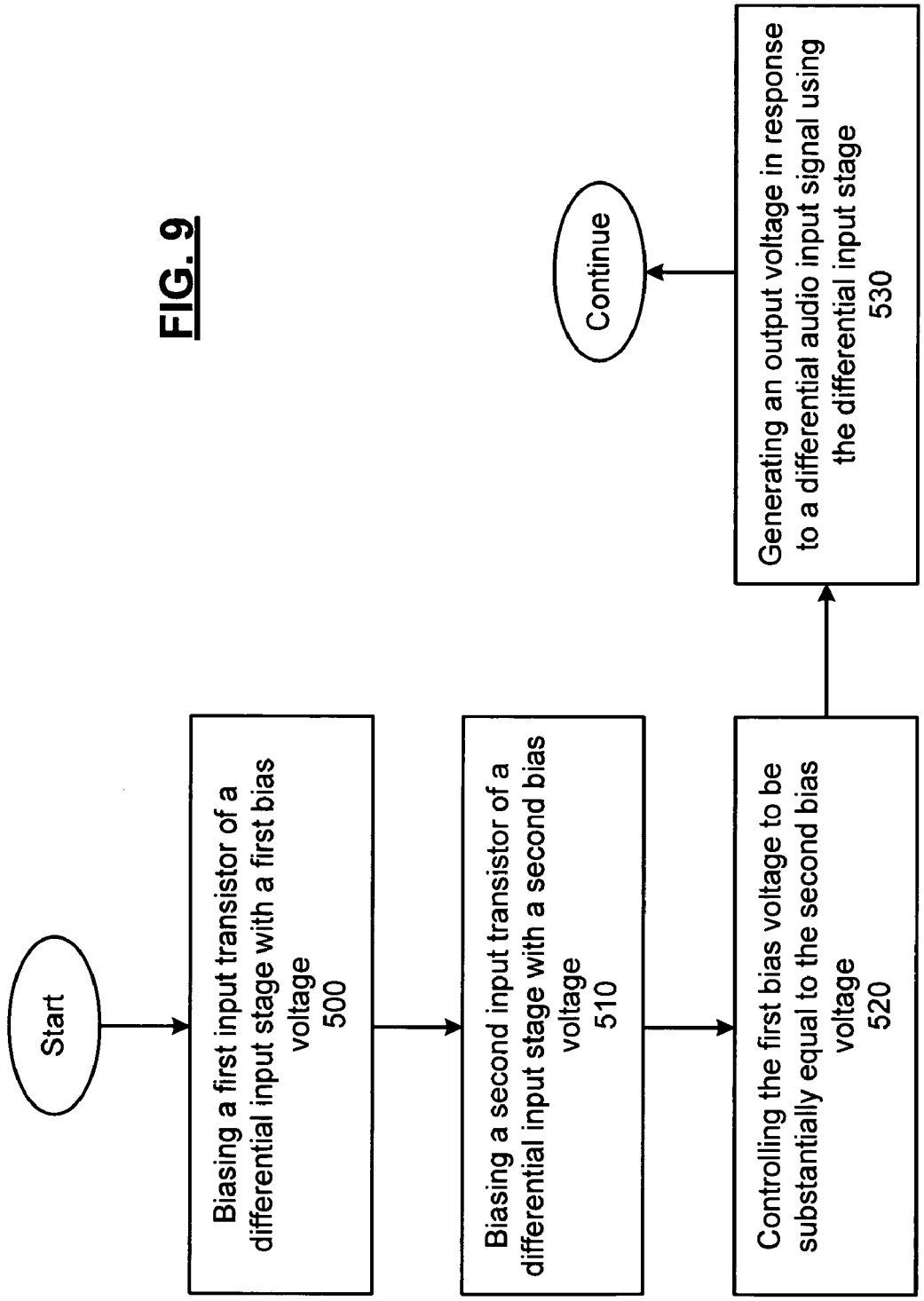

DIFFERENTIAL AMPLIFIER AND METHODS FOR USE THEREWITH

BACKGROUND OF THE INVENTION

1. Technical Field of the Invention

The present invention relates to differential amplifiers and related methods.

2. Description of Related Art

As is known, audio signals are processed by a wide variety of electronic equipment, including portable, or handheld, devices. Such devices include laptop, notebook and other personal computers, personal digital assistants (PDA), CD players, MP3 players, DVD players, AM/FM radios, cellular telephones, etc. Each of these devices includes one or more integrated circuits to provide the functionality of the device. As an example, a computer may include an audio amplifier integrated circuit to support the processing of audio signals in order to produce an audio output that is delivered to the user through speakers, headphones or the like.

One measure of an audio amplifier's performance is total harmonic distortion (THD). When an audio signal is distorted such as by clipping, saturation or other nonlinear effects, undesirable harmonics are generated from each fundamental frequency of the input signal. THD measures the percentage of an output waveform that constitutes these harmonics as a percentage of the total output. It is desirable to design audio amplifiers with small THD in the range of 0.01% or less. This specification can be difficult to maintain for large output voltage swings as the components of the amplifier reach physical device limitations, leave intended operating regions such as regions of linear operation and/or approach the supply voltages that power these devices.

The need exists for audio amplifiers that provide greater output voltage swings while maintaining low THD.

BRIEF DESCRIPTION OF THE SEVERAL VIEWS OF THE DRAWINGS

FIG. 9 presents a flowchart representation of a method in accordance with the present invention.

DETAILED DESCRIPTION OF THE INVENTION INCLUDING THE PRESENTLY PREFERRED EMBODIMENTS

Figure 1:
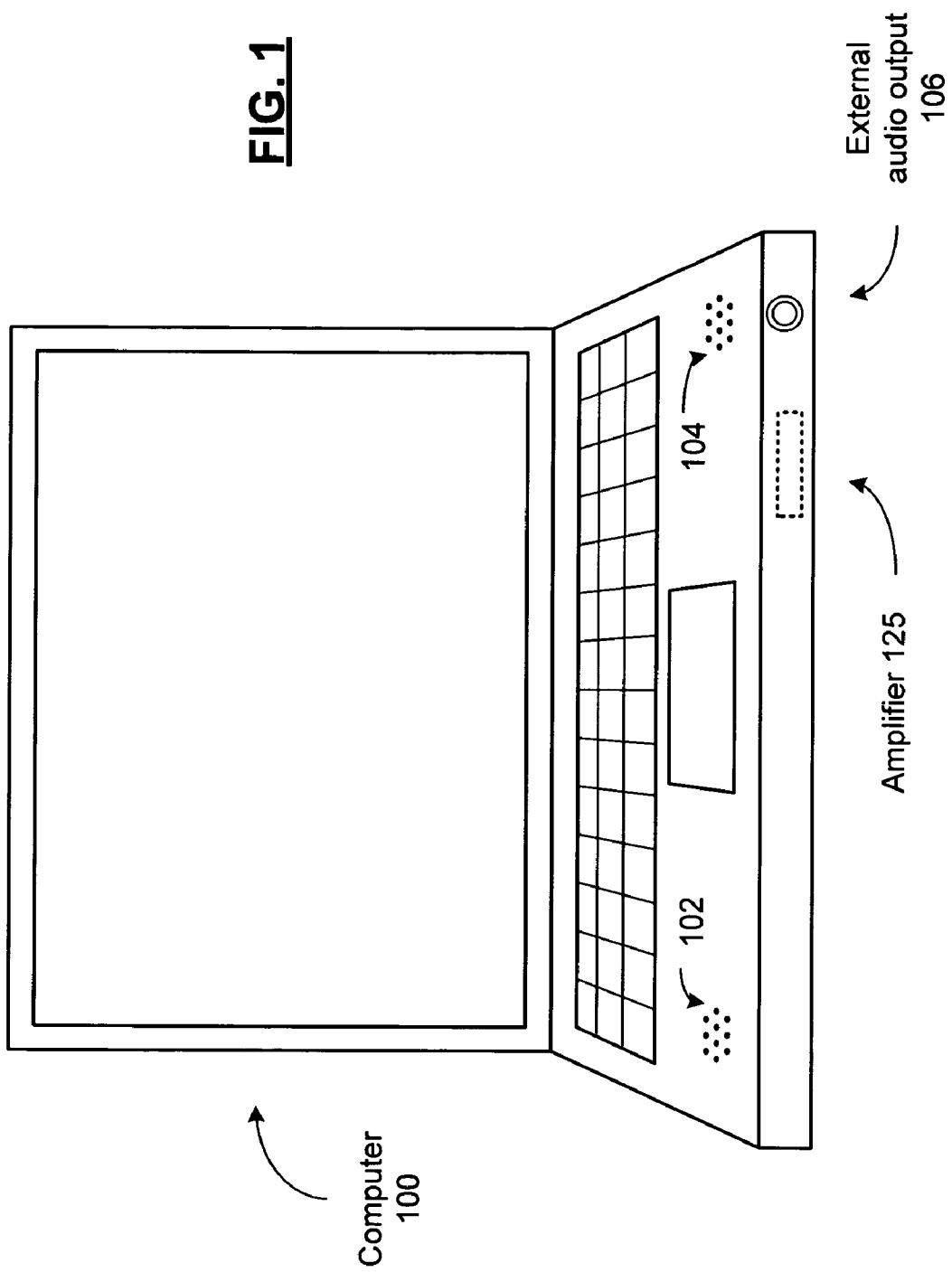
FIG. 1 presents a pictorial view of a computer in accordance with an embodiment of the present invention.
Figure 4:
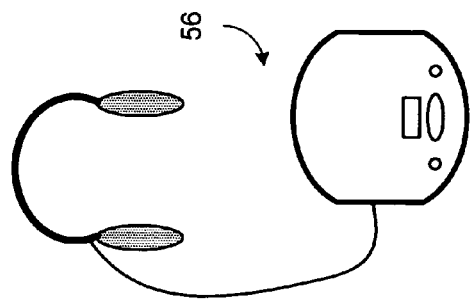
FIGS. 2-5 present pictorial views of various handheld audio devices in accordance with embodiments of the present invention.
Figure 3:
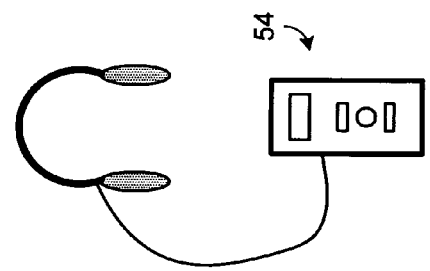
Figure 5:
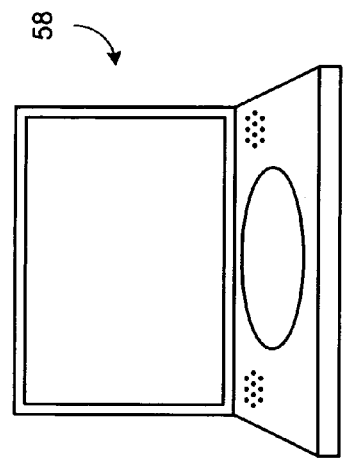
Figure 2:
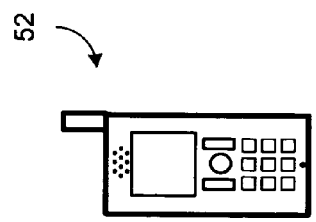

FIG. 1 presents a pictorial view of a computer in accordance with an embodiment of the present invention. In particular, computer 100 includes amplifier 125 for producing audio signals, such as music, speech signals, audio tracks of movies or other signals, that are stored in memory, on a disk, flash drive or other removable storage medium, or from a streaming source of audio content from an audio codec or other audio processing device. Amplifier 125 provides an output signal to integrated speakers 102 and 104. In addition, computer 100 includes an external audio output 106 such as an output jack, for coupling the output signal to external audio output devices such as speakers, stereo systems, headphones, ear buds, or the like.

Amplifier 125 includes various features and functions in accordance with the present invention that will be described in conjunction with the figures that follow.

FIGS. 2-5 present pictorial views of various handheld audio devices in accordance with embodiments of the present invention. While the amplifier 125 has been described in conjunction with its use in a computer such as computer 100, amplifier 125 may likewise be incorporated in a cellphone 52, handheld audio device 54 for replaying stored audio files, compact disk player 56 and/or digital video disk play 58 along with other audio devices, and other electronic devices that process audio signals to provide an audio output. In addition, while described in terms of an audio application, amplifier 125 can be used as a general differential amplifier for any of a wide range of signals, including video signals, analog sensor voltages, control signals, radio frequency signals, and other differential signals requiring amplification.

Figure 6:
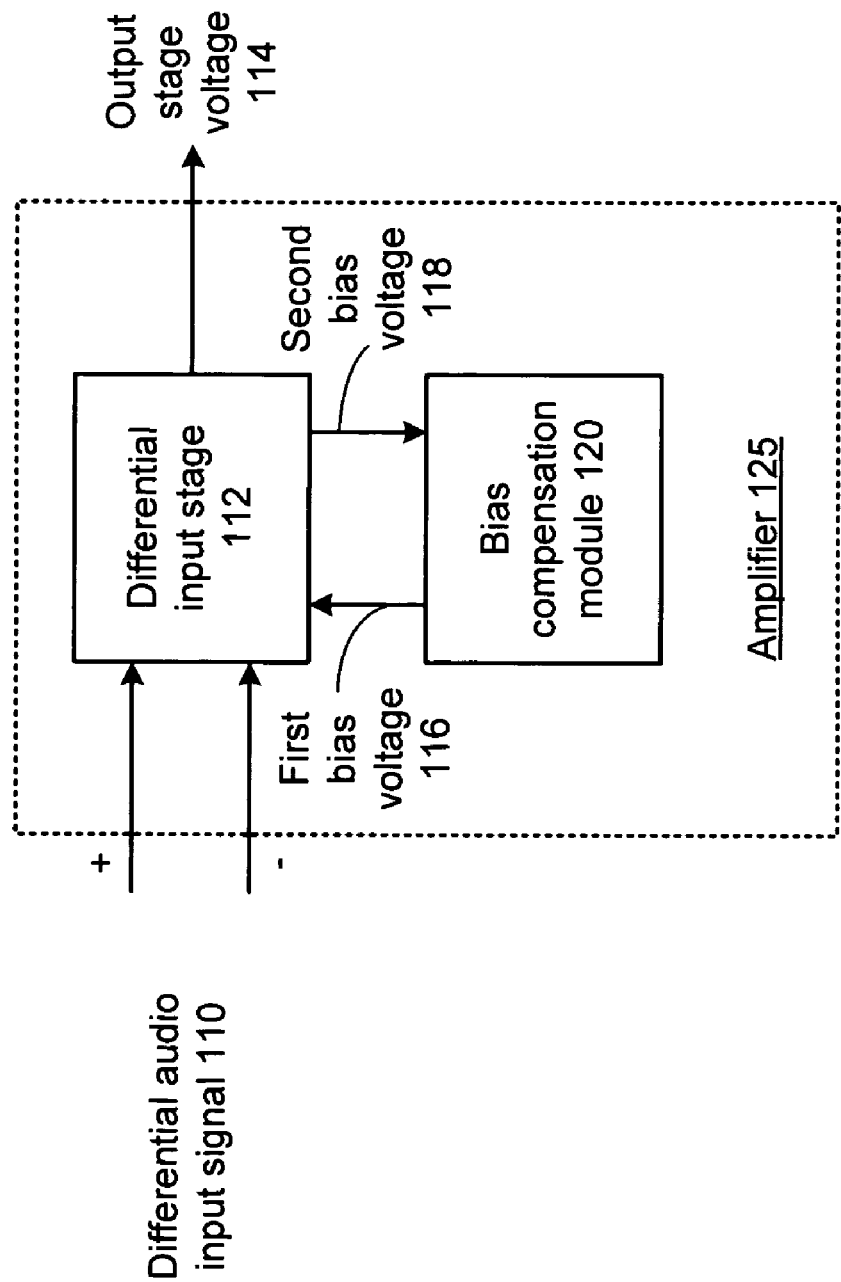
FIG. 6 presents a block diagram representation of an amplifier 125 in accordance with an embodiment of the present invention.

FIG. 6 presents a block diagram representation of an amplifier 125 in accordance with an embodiment of the present invention. In particular, amplifier 125 includes a differential input stage 112, for producing an output voltage 114 in response to a differential audio input signal 110. The differential input stage 112 has a first bias voltage 116 and a second bias voltage 118 that are coupled to bias compensation module 120. Bias compensation module 120 controls first bias voltage 116 to be substantially equal to the second bias voltage 118.

In an embodiment of the present invention, output stage voltage 114 is coupled, such as by alternative current (AC) coupling and optionally through an additional output stage, to an audio output device such as a single speaker that provides an output as a monaural output, or provides an output as one of a plurality of speakers for providing a multi-channel output such as a stereo output, surround sound output, 5.1 or 7.1 channel output, etc. Such an audio output device can include stereo system inputs or speakers having their own amplification that present a high impedance such as 10 kΩ or more. Alternatively, audio output may include one or more loudspeakers, headphones or ear buds having low impedances such as 1 kΩ or as low as a few Ohms. Amplifier 125 is capable of supplying sufficient power to drive such audio output device(s) that may be coupled thereto.

In an embodiment of the present invention, the differential input stage 112 has a first input transistor and a second input transistor coupled to the separate polarities of the differential audio input signal 110. The first transistor has characteristics substantially matched to characteristics of the second transistor, and the first bias voltage biases the first input transistor and the second bias voltage biases the second input transistor. By controlling the first bias voltage to be substantially the same as the second bias voltage, the differential input stage is able maintain gain when the output voltage is near the supply rails, improving the THD performance of the stage when large swings of the output voltage occur.

Figure 7:
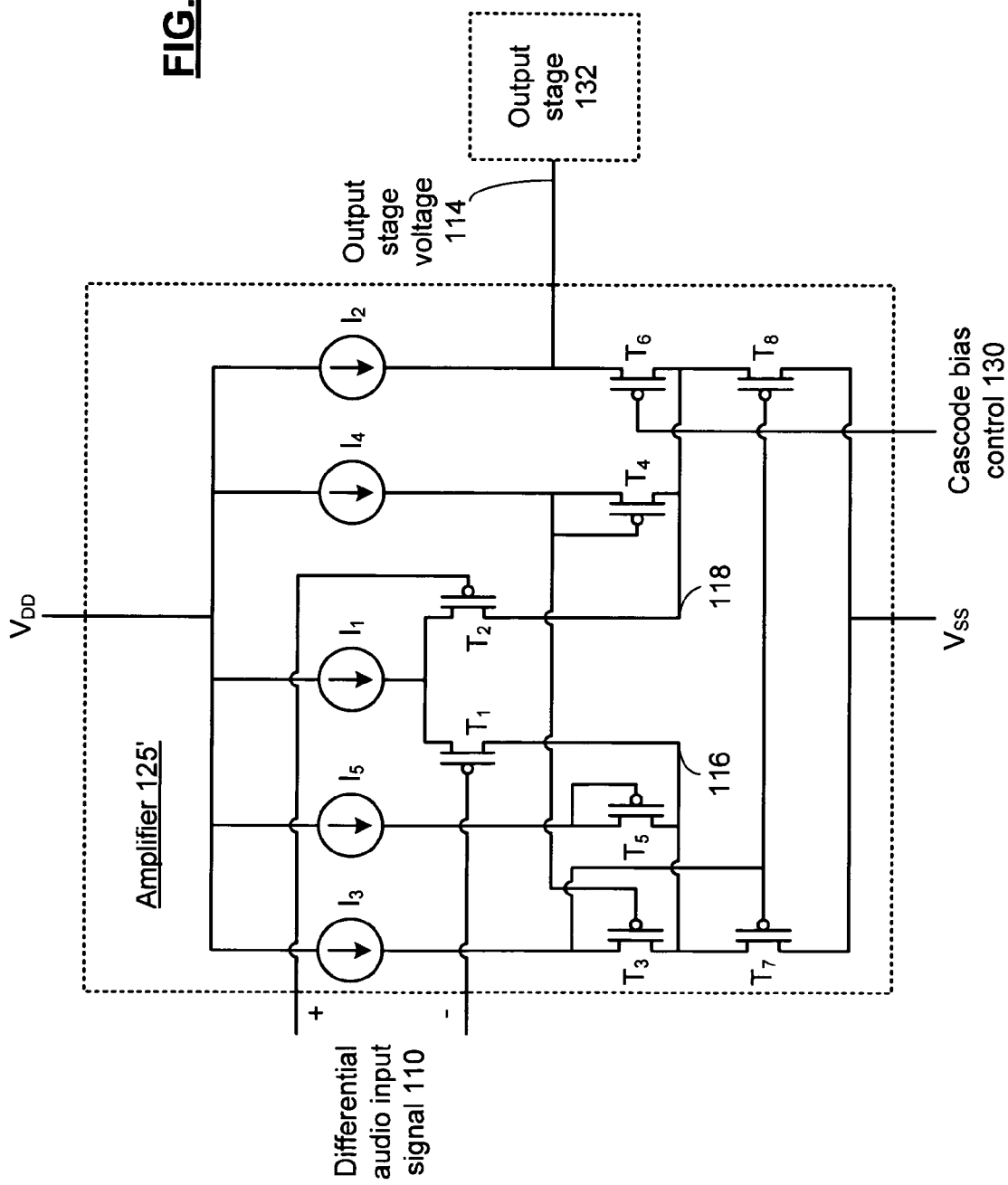
FIG. 7 presents a schematic/block diagram representation of an amplifier 125' in accordance with an embodiment of the present invention.

Further details including one possible circuit embodiment is shown in conjunction with FIG. 7.

FIG. 7 presents a schematic/block diagram representation of an amplifier 125' in accordance with an embodiment of the present invention. Amplifier 125' presents one possible circuit implementation of amplifier 125 that can be used in place of amplifier 125 in any of the applications and implementations discussed herein. In particular, a differential folded cascode amplifier circuit is presented that includes a differential input stage 112 including p-channel metal oxide semiconductor (PMOS) transistors $T_1, T_2, T_6, T_7,$ and $T_8$ and current sources $I_1, I_2,$ and $I_3$. The characteristics of transistors $T_1$ and $T_2$ are matched as well as transistor $T_7$ and $T_8$ to provide a common mode output as small as possible in response to common signals applied to the opposite polarities of the differential input on the gates of transistors $T_1$ and $T_2$. Cascode bias control 130 and transistor $T_6$ set up the quiescent voltage of the second bias voltage 118. In an embodiment of the present invention, $V_{DD}$, is a positive voltage and $V_{SS}$, is ground, circuit ground or other virtual ground potential. In this case the DC level of output voltage 114 is chosen to be approximately half of $V_{DD}$, such as in the range of $0.4V_{DD}$-$0.6V_{DD}$ during a quiescent state. In the presence of large differential mode signals, the output voltage 114 can swing upward to approach $V_{DD}$, and downward to approach $V_{SS}$, causing a commensurate drop in second bias voltage 118 and hampering the operation of the current mirror established between T7 and T8, reducing the gain of the stage.

In this case, the biasing of transistor $T_7$ is altered by bias compensation module 120 that includes transistors $T_3$ and $T_4$ and current sources $I_3$ and $I_4$. Transistors $T_3$ and $T_4$ are arranged in a configuration that controls the first bias voltage 116 to be substantially equal to the second bias voltage 118. As the biasing of transistor $T_8$ is altered, so is the biasing of transistor $T_7$. While the characteristics of each of these transistors is altered by the altered biasing, the transistors $T_7$ and $T_8$ are matched and the characteristics are altered in the same way. This preserves the mirror ratio and thus the gain of differential input stage 112 for wider output voltage swings.

In the embodiment of the present invention that is shown, bias compensation module 120 further includes a current equalizer module, operably coupled to the differential input stage, for balancing a current offset produced by the bias compensation module. In particular, transistor $T_5$ and current source $I_5$ are included to match transistor $T_4$ and current source $I_4$ and to balance the current in differential input stage 112.

In an embodiment of the present invention, optional output stage 132 is included that can be a class A output stage, class AB output stage or alternative circuit configuration that includes one or more transistors such as field effect transistors, bipolar junction transistors, etc. In an embodiment, the elements of amplifier 125 and/or 125' are implemented on one or more integrated circuits and/or that may optionally include one or more discrete components.

Figure 8:
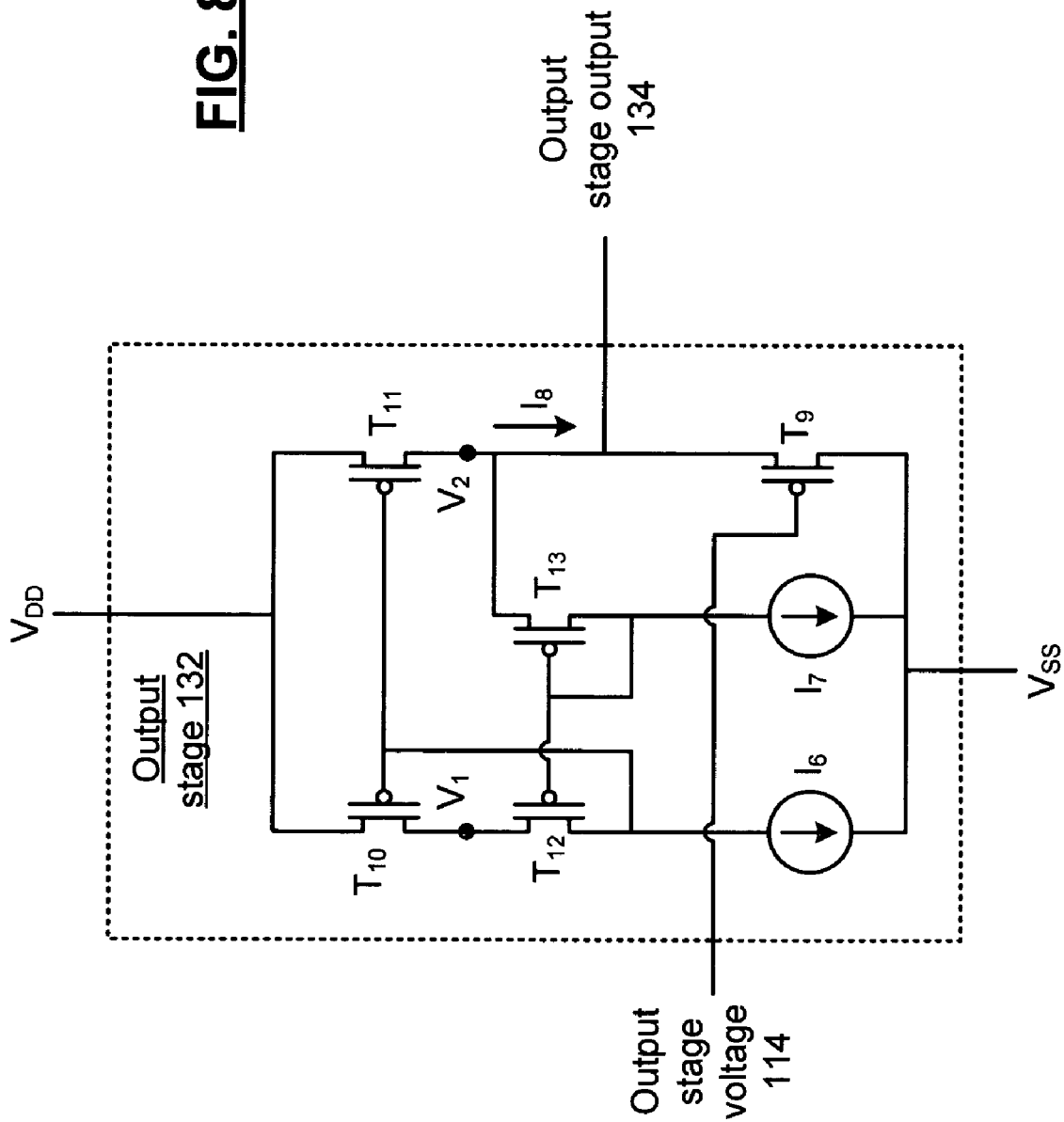
FIG. 8 presents a schematic representation of an output stage in accordance with an embodiment of the present invention.

FIG. 8 presents a schematic representation of an output stage in accordance with an embodiment of the present invention. One possible implementation of output stage 132 is presented. In particular, a class A output stage is presented that includes transistor $T_9$ for producing output stage output 134 in response to output voltage 114. Transistors $T_{10}$ and $T_{11}$ control the currents so that $\Delta I_6 \approx \Delta I_8$. In addition, transistors $T_{12}$ and $T_{13}$ control bias voltage $V_1$ and $V_2$ so that $V_1 \approx V_2$, increasing the output swing of output stage 134 for low distortion.

FIG. 9 presents a flowchart representation of a method in accordance with the present invention. In particular, a method is presented for use in conjunction with one or more of the features and function described in association with FIGS. 1-8. In step 500, a first input transistor of a differential input stage is biased with a first bias voltage. In step 510, a second input transistor of the differential input stage is biased with a second bias voltage. In step 520, the first bias voltage is controlled to be substantially equal to the second bias voltage. In step 530, an output voltage is generated in response to a differential audio input signal using the differential input stage. In an embodiment of the present invention, step 520 includes balancing a current offset.

The various functional modules disclosed herein, while described as circuits, can be implemented using hardware or using processing module such as a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions that are stored in memory. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated herein.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to order of magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

In preferred embodiments, the various circuit components are implemented using 0.35 micron or smaller CMOS technology. Provided however that other circuit technologies including other transistor, diode and resistive logic, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing an differential audio amplifier that can be implemented on an integrated circuit such as a system on a chip integrated circuit. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A differential audio amplifier comprising:
a differential input stage, for producing an output voltage in response to a differential audio input signal, wherein the differential input stage has a first input transistor and a second input transistor coupled to separate polarities of the differential audio input signal, wherein the first transistor has characteristics substantially matched to characteristics of the second transistor, and wherein a first bias voltage biases the first input transistor and a second bias voltage biases the second input transistor of the differential input stage; and
a bias compensation module, operatively coupled to the differential input stage, including a current mirror circuit having a third transistor and a fourth transistor for controlling first bias voltage to be substantially equal to the second bias voltage and for increasing a voltage swing of the output voltage, the bias compensation module including a current equalizer module, operably coupled to the differential input stage for balancing a current offset produced by the bias compensation module wherein the current equalizer module includes a fifth transistor, and wherein the fifth transistor has characteristics substantially matched to characteristics of the fourth transistor.

2. The differential audio amplifier of claim 1 wherein the differential input stage and the bias compensation module are included in a differential folded cascode amplifier circuit.

3. The differential audio amplifier of claim 1 wherein the differential input stage andthe bias compensationmodule are implemented on an integrated circuit.

4. A differential amplifier comprising:
a differential input stage, for producing an output voltage in response to a differential audio input signal, the differential input stage having a first bias voltage and a second basis voltage, wherein the differential input stage has a first input transistor and a second input transistor coupled to the separate polarities of the differential audio input signal, wherein the first transistor has characteristics substantially matched to characteristics of the second transistor, and wherein the first bias voltage biases the first input transistor and the second bias voltage biases the second input transistor of the differential input stage; and
a bias compensation module, operatively coupled to the differential input stage, for controlling first bias voltage to be substantially equal to the second bias voltage, wherein the bias compensation module includes a current equalizer module, operably coupled to the differential input stage for balancing a current offset produced by the bias compensation module, wherein the bias compensation module includes a current mirror circuit having a third transistor and a fourth transistor, wherein the current equalizer module includes a fifth transistor, and wherein the fifth transistor has characteristics substantially matched to characteristics of the fourth transistor.

5. The differential amplifier of claim 4 wherein the bias compensation module increases a voltage swing of the output voltage.

6. The differential amplifier of claim 4 wherein the differential input stage and the bias compensation module are included in a differential folded cascode amplifier circuit.

7. The differential amplifier of claim 4 wherein the differential input stage and the bias compensation module are implemented on an integrated circuit.

* * * * *

UNITED STATES PATENT AND TRADEMARK OFFICE
CERTIFICATE OF CORRECTION

PATENT NO.         : 7,358,814 B2                             Page 1 of 1
APPLICATION NO. : 11/389779
DATED              : April 15, 2008
INVENTOR(S)        : Charles Eric Seaberg It is certified that error appears in the above-identified patent and that said Letters Patent is hereby corrected as shown below:

Column 6, line 8, in Claim 3: replace "compensationmodule" with --compensation module--.

Signed and Sealed this

Tenth Day of March, 2009

JOHN DOLL
*Acting Director of the United States Patent and Trademark Office*